(12) United States Patent
Le Neel et al.

(10) Patent No.: US 12,429,639 B2
(45) Date of Patent: Sep. 30, 2025

(54) OPTICAL FILTER AND CORRESPONDING MANUFACTURING METHOD

(71) Applicants: STMicroelectronics SA, Montrouge (FR); STMicroelectronics (Crolles 2) SAS, Crolles (FR)

(72) Inventors: Olivier Le Neel, Saint Martin D Uriage (FR); Stephane Zoll, Froges (FR); Stephane Monfray, Eybens (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 853 days.

(21) Appl. No.: 17/469,286

(22) Filed: Sep. 8, 2021

(65) Prior Publication Data
US 2022/0082743 A1 Mar. 17, 2022

(30) Foreign Application Priority Data
Sep. 11, 2020 (FR) ...................... 2009213

(51) Int. Cl.
*G02B 5/28* (2006.01)
*G02B 5/18* (2006.01)
(Continued)

(52) U.S. Cl.
CPC ............. *G02B 5/28* (2013.01); *G02B 5/1857* (2013.01); *H10F 77/337* (2025.01); *H10F 77/50* (2025.01); *G01S 7/4816* (2013.01)

(58) Field of Classification Search
CPC ........ G02B 5/28; G02B 5/1857; G02B 1/002; G02B 1/111; G02B 2207/101;
(Continued)

(56) References Cited

U.S. PATENT DOCUMENTS 5,726,805 A * 3/1998 Kaushik ................. G02B 5/201
359/590
6,035,089 A 3/2000 Grann et al.
(Continued)

FOREIGN PATENT DOCUMENTS

CN 1419658 A 5/2003
CN 110243471 A 9/2019
(Continued)

OTHER PUBLICATIONS

INPI Search Report and Written Opinion for FR Appl. No. 2009213 dated May 28, 2021 (14 pages).
(Continued)

*Primary Examiner* — Mustak Choudhury
(74) *Attorney, Agent, or Firm* — Crowe & Dunlevy LLC (57) ABSTRACT

An optical filter includes a carrier layer made of a first material. A periodic grating of posts is disposed on the carrier layer in a periodic pattern configured by characteristic dimensions. The posts are made of a second material. A layer made of a third material encompasses the periodic grating of posts and covers the carrier layer. The third material has a refractive index that is different from a refractive index of the second material. Characteristic dimensions of the periodic grating of posts are smaller than an interfering wavelength and are configured to selectively reflect light at the interfering wavelength on the periodic grating of posts.

17 Claims, 4 Drawing Sheets

(51) Int. Cl.
*H10F 77/30* (2025.01)
*H10F 77/50* (2025.01)
*G01S 7/481* (2006.01)

(58) Field of Classification Search
CPC ........ G02B 5/203; G02B 5/207; G02B 5/208; G02B 5/281; G02B 5/1809; G01S 7/4816; H01L 31/0203; H01L 31/02165; B82Y 20/00
See application file for complete search history.

(56) References Cited

U.S. PATENT DOCUMENTS

| | | | | |
|---|---|---|---|---|
| 9,052,454 | B2* | 6/2015 | Vincent | G02B 5/1809 |
| 2003/0039446 | A1* | 2/2003 | Hutchinson | G02B 6/1225 |
| | | | | 385/27 |
| 2004/0120644 | A1* | 6/2004 | Chou | G02B 6/138 |
| | | | | 385/129 |
| 2012/0269483 | A1* | 10/2012 | Mossberg | G02B 5/1809 |
| | | | | 385/37 |

FOREIGN PATENT DOCUMENTS

| | | |
|---|---|---|
| CN | 216434426 U | 5/2022 |
| EP | 2613181 A1 | 7/2013 |
| WO | 2013003890 A1 | 1/2013 |
| WO | 2018228807 A1 | 12/2018 |

OTHER PUBLICATIONS

CN First Office Action and Search Report for counterpart CN Appl. No. 202111062406.9, report dated Dec. 28, 2024, 10 pgs.

* cited by examiner

OPTICAL FILTER AND CORRESPONDING MANUFACTURING METHOD

PRIORITY CLAIM

This application claims the priority benefit of French Application for Patent No. 2009213, filed on Sep. 11, 2020, the content of which is hereby incorporated by reference in its entirety to the maximum extent allowable by law.

TECHNICAL FIELD

The present invention relates to the field of optics and more particularly the field of optical filters located, for example, facing integrated optical components.

BACKGROUND

An integrated optical component that is sensitive to external light can be subjected, during its lifetime, to a multitude of interfering light rays from third-party electronic devices, for example high-energy laser radiation.

As a result, depending on the material of the integrated optical component and depending on the energy received, the light received by the component will be transformed into electrons and/or will locally increase the temperature of the component from a few tens of degrees to several hundred degrees. This heating can thus lead to malfunctions and damage to the optical component.

Moreover, regulatory standards can increase the probability of the integrated optical component receiving light rays at specific interfering wavelengths. This is, for example, the case with LIDAR (Light Detection And Ranging) type application standards, wherein the wavelengths of the lasers used are standardized, typically in the infrared.

Conventionally, the optical component can be protected from an interfering wavelength by a band-stop filter covering a frequency range comprising the interfering wavelength.

Nonetheless, a conventional band-stop filter cannot be used in applications requiring the use of a wavelength close to or within the filtered band, which is, for example, the case of applications using infrared signals of the TOF (Time Of Flight) measurement type, infrared facial recognition, or for night vision cameras.

As a result, the optical components should be selectively protected from specific interference wavelengths.

SUMMARY

According to one aspect, an optical filter includes: a carrier layer comprising a first material; a periodic grating of posts disposed on the carrier layer in a periodic pattern configured by characteristic dimensions, the posts comprising a second material; and a layer comprising a third material encompassing the periodic grating of posts and covering the carrier layer, the third material having a refractive index that is different from a refractive index of the second material, wherein the characteristic dimensions of the periodic grating of posts are smaller than an interfering wavelength and configured to selectively reflect light at the interfering wavelength on the periodic grating of posts.

In other words, the characteristic dimensions of the periodic grating are configured to produce, selectively on light rays at the interfering wavelength, constructive light interference on one side of the periodic grating, and destructive light interference on the other side of the periodic grating.

The periodic grating of posts is configured to exploit a quantum resonance effect that produces a reflection of light specifically at the interfering length.

Moreover, the quantum resonance effect is selective for the interfering wavelength, so the periodic grating does not reflect any wavelength other than the interfering wavelength, allowing the optical filter to be used in applications requiring the use of a wavelength close to the filtered interfering wavelength.

According to one embodiment, the first material, the second material, and the third material are selected such that the optical filter is transparent to light having a wavelength comprised in a wavelength range comprising the interfering wavelength, except at the interfering wavelength.

Thus, since the optical filter is transparent for a wavelength range with the exception of the interfering wavelength, the transmitted light signals are not or only slightly altered, even for wavelengths close to the interfering wavelength, for example by plus or minus fifteen nanometers relative to the interfering wavelength.

According to one embodiment, each post has a cylindrical shape with a diameter and a height, the characteristic dimensions comprising said diameter and said height.

Thus, each cylindrical post is axially symmetrical, allowing incident light rays to be reflected isotropically relative to the axis of symmetry of each cylinder.

The reflection is thus advantageously neutral with regard to possible polarization of the light.

Moreover, the choice of the diameter and height of the posts (as well as the choice of the pitch of the grating) allows the reflectivity and the interfering wavelength on the periodic grating to be configured.

According to one embodiment, the periodic grating of posts is disposed on the carrier layer in a periodic arrangement comprising a unit cell of posts repeated with a fixed period, the characteristic dimensions comprising said fixed period.

The disposition of the posts of the grating in a lattice (i.e., a periodic grating with a rectangular, square or hexagonal unit cell for example (these examples being non-limiting)) allows a simple and versatile design to uniformly cover the carrier layer with posts.

Thus, the periodic arrangement of the unit cells allows light at the interfering wavelength to be uniformly reflected on the periodic grating.

Moreover, the choice of lattice and the fixed period of repetition of the unit cell, also known as the grating pitch, allows the interfering wavelength reflected by the periodic grating to be configured.

According to one embodiment, the optical filter further includes a first face covered by a stack of anti-reflective layers, and the stack of anti-reflective layers is configured to correct an initial angle of incidence of incident light rays on the side of the first face of the optical filter, relative to a normal of the first face of the optical filter, such that an angle of incidence of incident light rays on the periodic grating is closer to said normal than the initial angle of incidence.

In other words, the stack of anti-reflective layers rectifies the initial incident light rays so that the angle of the incident rays on the periodic grating is closer to the normal.

In this way, the stack of anti-reflective layers makes it possible to increase the maximum reflective gain and to increase the selectivity of the reflection for incident rays with a non-zero angle relative to the normal.

According to one embodiment, the interfering wavelength is an infrared wavelength defined by a standard for automotive applications of detecting and estimating distance using light (such as, for example, LIDAR).

Thus, the periodic grating is specifically configured to allow radiation from "LIDAR"-type applications to be reflected, in order to protect an optical element from such radiation.

According to one embodiment, the first material, the second material, and the third material are dielectric or semiconductor materials.

More specifically, electromagnetic phenomena can affect the resonance effect of the reflection, in particular by altering the selectivity of the reflection of the interfering wavelength.

Thus, dielectric or semiconductor materials advantageously do not produce an electromagnetic antenna effect.

According to one embodiment, the first material is silicon nitride, the second material is silicon nitride and the third material is silicon oxide.

More specifically, the above materials are materials commonly used in the manufacture of integrated circuits; use thereof is thus controlled and inexpensive in the overall context of industrial methods in the field of microelectronics.

According to one embodiment, the first material is silicon nitride, the second material is silicon oxide and the third material is amorphous silicon or polycrystalline silicon.

More specifically, the above materials are materials commonly used in the manufacture of integrated circuits; use thereof is thus controlled and inexpensive in the overall context of industrial methods in the field of microelectronics.

Moreover, amorphous silicon is also known to have a high refractive index compared to the refractive index of silicon nitride, which makes it possible to increase the refractive index contrast between the second material, silicon oxide according to this embodiment, and the third material, amorphous silicon in this example, to improve, or at least configure, the selectivity of the reflection at the interfering wavelength.

According to another aspect, an electronic device comprises an optical filter according to at least one of the embodiments defined hereinabove, a light-sensitive electronic chip, and a housing, the optical filter being integrated into the housing and located facing the electronic chip so as to filter the light received by the chip.

According to another aspect, a vehicle comprises the electronic device defined hereinabove.

According to another aspect, an optical filter manufacturing method comprises: forming a carrier layer comprising a first material; forming a layer of a second material on the carrier layer; etching, in the layer of the second material, a periodic grating of posts having a periodic pattern configured by characteristic dimensions; and forming a layer of a third material, on the carrier layer, encompassing the posts; wherein the characteristic dimensions of the periodic grating are smaller than an interfering wavelength and configured to selectively reflect light at the interfering wavelength on the periodic grating of posts.

According to one implementation, the first material, the second material, and the third material are selected such that the optical filter is transparent to light having a wavelength comprised in a wavelength range comprising the interfering wavelength, except at the interfering wavelength.

According to one implementation, the posts of the periodic grating are etched to obtain a cylindrical shape with a diameter and a height, the characteristic dimensions comprising said diameter and said height.

According to one implementation, the posts of the periodic grating are etched so as to be disposed in a periodic arrangement of posts comprising a unit cell of posts repeated with a fixed period, the characteristic dimensions comprising said fixed period.

According to one implementation, the method further comprises forming a stack of anti-reflective layers on a first face configured to correct an initial angle of incidence of incident light rays on the side of the first face of the optical filter, relative to a normal of the first face of the optical filter, such that an angle of incidence of incident light rays on the periodic grating is closer to the normal than the initial angle of incidence.

According to one implementation, the interfering wavelength is an infrared wavelength defined by a standard for automotive applications of detecting and estimating distance using light (such as, for example, LIDAR).

According to one implementation, the first material, the second material, and the third material are dielectric or semiconductor materials.

According to one implementation, the first material is silicon nitride, the second material is silicon nitride and the third material is silicon oxide.

According to one implementation, the first material is silicon nitride, the second material is silicon oxide and the third material is amorphous silicon or polycrystalline silicon.

BRIEF DESCRIPTION OF THE DRAWINGS

Other advantages and features will become apparent upon examining the detailed description of non-limiting embodiments and implementations of the invention, and from the accompanying drawings in which.

DETAILED DESCRIPTION

FIG. 1A to 1E show a method for manufacturing an optical filter FLT1 dedicated to excluding an interfering wavelength from a spectrum of incident light rays on the filter. Selective exclusion of the interfering wavelength is obtained by reflecting light rays at the interfering wavelength on a periodic grating of posts RP.

The periodic grating RP is configured such that light at the interfering wavelength causes constructive interference on one side of the periodic grating where light rays are received, and destructive interference on an opposite side of the periodic grating through which the rest of the received light rays are transmitted.

Figure 1A:
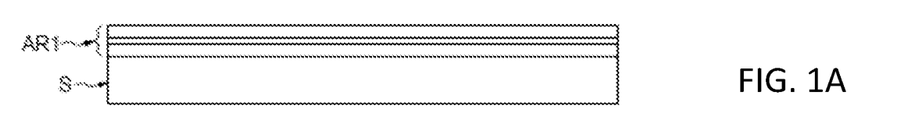
FIG. 1A to FIG. 1E show steps in a method for manufacturing an optical filter.

FIG. 1A shows a sacrificial substrate seed S, on which the optical filter FLT1 is manufactured. The substrate seed S is, for example, made of silicon or silicon oxide and is intended to be removed at the end of the manufacturing process.

A first stack of anti-reflective layers AR1 is formed on the substrate seed S and comprises three layers; it goes without saying that a larger number of layers can be produced in an anti-reflective stack.

The first stack of anti-reflective layers AR1 comprises a set of thin layers of specific materials of different optical indices.

Figure 1B:
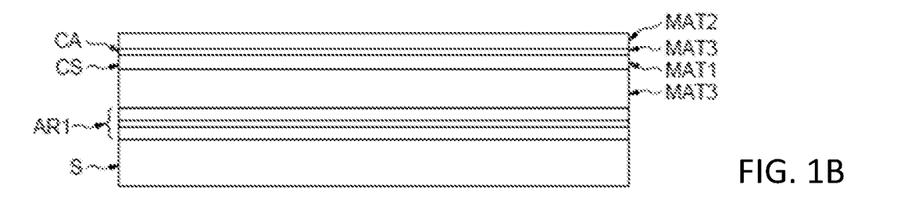

FIG. 1B in particular shows the result of forming a carrier layer CS and of forming a layer intended to form the periodic grating of posts RP.

A first transparent and rigid layer in a third material MAT3, for example silicon oxide, can be formed on the first stack of anti-reflective layers AR1. The first transparent and rigid layer is used to position the periodic grating RP at an optimal distance from the first stack of anti-reflective layers AR1 and to mechanically solidify the optical filter without altering the optical properties of the filter.

The carrier layer CS in the first material MAT1 is then formed on the first transparent, rigid layer of the third material MAT3.

The carrier layer CS is then covered with a layer intended to form the periodic grating RP in the second material MAT2.

At this stage of manufacture, the optical filter FLT1 comprises a stack comprising the carrier layer CS, in a first material MAT1, superimposed on the layer intended to form the periodic grating of posts, in a second material MAT2.

The first material MAT1 is, for example, silicon nitride and the second material MAT2 is, for example, also silicon nitride.

In the case whereby the first material MAT1 and the second material MAT2 are the same, a barrier layer CA is formed between the carrier layer CS and the layer intended to form the posts.

The barrier layer CA is used to form a protective layer intended to protect the integrity of the carrier layer CS when etching the posts of the periodic grating. The barrier layer is formed in a material that is different from the first material MAT1 and from the second material MAT2, and can be identified during etching in order to mark the etch stop.

The barrier layer CA is, for example, made of silicon oxide when the first material MAT1 and the second material MAT2 are made of silicon nitride.

The thickness of the barrier layer CA is negligible compared to the thickness of the carrier layer CS. Thus, the term carrier layer CS will be used hereinbelow to refer to the stack of the carrier layer CS and of the barrier layer CA.

Figure 1C:
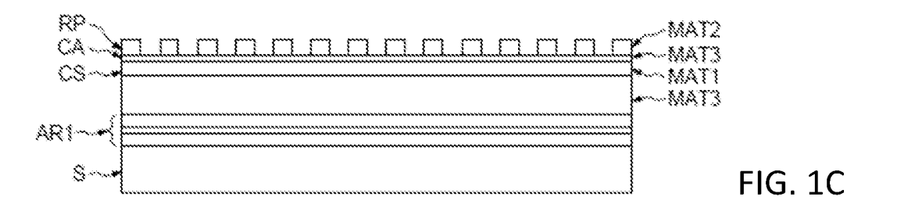

FIG. 1C shows a result of an etching of the posts of the periodic grating RP in the layer of the second material MAT2 using a lithographic mask in a periodic pattern.

The steps leading to the result shown comprise forming a lithographic mask with a periodic pattern configured by characteristic dimensions, on the layer intended to form the periodic grating RP.

The lithographic mask defines the shape of the top faces of the posts of the periodic grating RP. The thickness of the layer intended to form the periodic grating RP defines the height of the posts.

For example, in order to manufacture cylindrical posts arranged in a grid pattern on the carrier layer CS, the lithographic mask comprises a grid of circular openings.

The layer of the second material MAT2 is etched through the lithographic mask to form posts distributed periodically on the carrier layer CS.

Figure 1D:
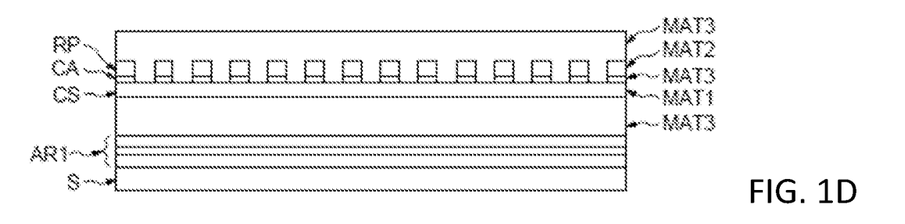

FIG. 1D shows a result of forming a layer in a third material MAT3, encompassing (i.e., covering or encapsulating) the posts of the periodic grating RP, and deposited on free portions of the carrier layer CS.

The steps leading to the result shown comprise forming a layer encompassing the posts of the periodic grating on the posts and portions of the carrier layer CS left free.

The posts of the periodic grating RP are formed in the second material MAT2 and the layer encompassing the posts is formed in the third material MAT3.

The layer encompassing the posts can cover side faces of the posts and/or top faces of the posts. More specifically, the term encompassing the posts is understood to mean either covering both the flanks and the top of the posts or only covering the flanks of the posts.

The layer encompassing the posts and top surfaces of the posts can be subjected to chemical-mechanical polishing so as to form a planar surface intended to receive a second transparent and rigid layer, for example in the third material MAT3.

The second transparent and rigid layer can be bonded to the planar surface in order to solidify the optical filter, in particular for removing the substrate seed S.

The second transparent and rigid layer also allows the periodic grating RP to be positioned at an optimal distance from a second stack of anti-reflective layers AR2.

The manufacture of the optical filter FLT1 thus further comprises forming the second stack of anti-reflective layers AR2 on the second transparent and rigid layer.

The substrate seed S is then removed.

Figure 1E:
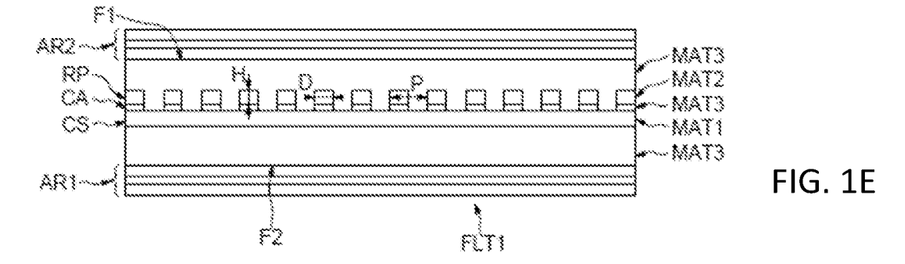

FIG. 1E shows the optical filter FLT1 resulting from the method described with reference to the steps of FIG. 1A to FIG. 1E.

The optical filter FLT1 comprises a first face F1 opposite a second face F2, the optical filter FLT1 is flat, and can take the form of a wafer or a disc. The periodic grating of posts RP is located inside the optical filter FLT1, parallel to the first and second faces F1, F2 of the optical filter FLT1.

The optical filter FLT1 can receive incident light rays indifferently on either the first face F1 side or the second face F2 side without modifying the interfering wavelength reflection effect.

In this respect, the first face F1 and the second face F2 of the filter each comprise a similar stack of anti-reflective layers AR1, AR2.

Figure 2:
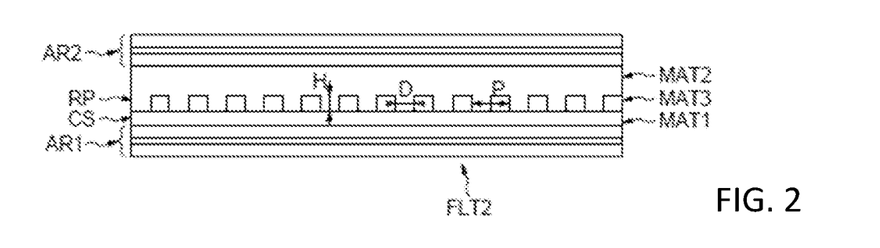
FIG. 2 shows an optical filter according to an alternative embodiment to that shown in FIG. 1E.

FIG. 2 shows an optical filter FLT2 according to an alternative embodiment to the optical filter FLT1 shown in FIG. 1E.

A carrier layer CS in a first material MAT1 covers a first stack of anti-reflective layers AR1. A periodic grating RP of posts in a second material MAT2 is disposed on the carrier layer CS.

The periodic grating RP of posts is surrounded by a layer in a third material MAT3. The layer in the third material MAT3 covers side faces of the posts and portions of the carrier layer CS left free.

Another layer of the second material MAT2 covers top faces of the posts and a top face of the layer of the third material MAT3.

The first material MAT1 is, for example, silicon nitride, the second material MAT2 is, for example, silicon oxide, and the third material MAT3 is, for example, amorphous silicon.

Steps for manufacturing the optical filter FLT2 comprise, in chronological order:
- forming the carrier layer CS in the first material MAT1, for example silicon nitride, on the first stack of anti-reflective layers AR1 deposited on a substrate seed S, for example made of silicon;
- forming the layer intended to form the periodic grating RP in the second material MAT2, for example made of silicon oxide, directly on the carrier layer CS, in the third material MAT3, for example amorphous silicon;
- forming a lithographic mask with a periodic pattern configured by characteristic dimensions, on the layer intended to form the periodic grating RP;
- etching, through the lithographic mask, the layer intended to form the periodic grating RP so as to form posts distributed periodically on the carrier layer CS of the periodic grating;
- forming a layer encompassing the posts of the periodic grating RP on the posts and portions of the carrier layer CS left free;
- chemical-mechanical polishing of the layer encompassing the posts so as to reveal the top faces of the posts of the periodic grating RP;
- forming another layer of the second material MAT2 covering the top faces of the posts and the layer encompassing the posts, for example by plasma-enhanced physical vapor deposition of silicon oxide obtained from a liquid source of tetraethyl orthosilicate; and
- forming a second stack of anti-reflective layers AR2 on the layer in the second material MAT2.

In the methods described with reference to FIG. 1A to FIG. 1E and FIG. 2, the first material MAT1, second material MAT2 and third material MAT3 can be different from the examples given hereinabove. Other combinations of materials can be chosen from among, for example, silicon nitride, silicon oxide, amorphous silicon, amorphous carbon, and silicon carbide.

Advantageously, the first, second, and third materials MAT1, MAT2, MAT3, are dielectric materials or semiconductor materials, in particular in order to avoid electromagnetic antenna effects, and/or are chosen such that the optical filter is transparent to light having a wavelength comprised within a wavelength range comprising the interfering wavelength, except at the interfering wavelength.

Figure 3:
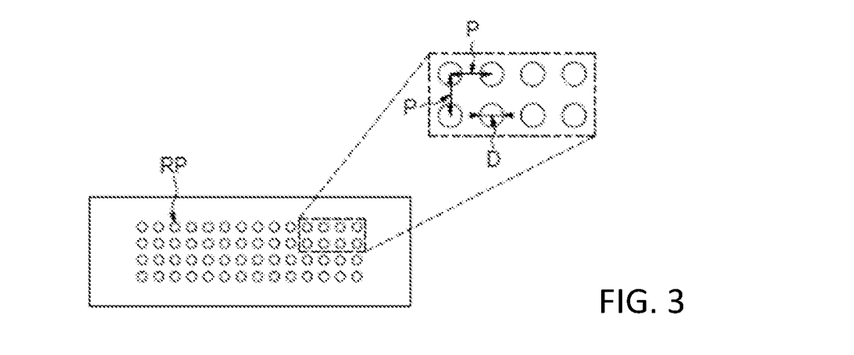
FIG. 3 shows an overhead view of that shown in FIG. 1C.

FIG. 3 shows an overhead view of that shown in FIG. 1C, showing the periodic grating RP, and an enlargement of the periodic grating RP.

The periodic grating RP of posts is a set of identical protruding posts disposed in a periodic arrangement on the carrier layer CS.

The posts of the periodic grating RP form an interference grating, the periodic arrangement whereof is configured to produce a reflection of light at the interfering wavelength.

A contour of the periodic grating RP is located at an interface between the second material and the third material and on portions of the carrier layer CS not occupied by posts.

The periodic grating RP of posts, in particular the contour of the grating, comprises characteristic dimensions that are smaller than the interfering wavelength, and the interface between the second material and the third material has a refractive index contrast.

Such an interface having dimensions smaller than the wavelength of interest is called a "meta-surface". A meta-surface is well known to a person skilled in the art, who can nonetheless refer, for all intents and purposes, to the scientific publication by Yu, et al., "Light Propagation with Phase Discontinuities: Generalized Laws of Reflection and Refraction", SCIENCE vol. 334 21/10/2011 (incorporated by reference), which gives an example definition of a meta-surface.

The interface is intended to produce light reflection by exploiting specific resonance properties to obtain perfect constructive interference on one side of the periodic grating RP and perfect destructive interference on the other side of the periodic grating RP.

The arrangement of the periodic grating RP comprises a unit cell of posts, typically polygonal in shape, and repeated with a period P. In particular, the fixed period P of repetition of the unit cells corresponds to the spacing between two similar corners of two adjoining unit cells.

A unit cell of the periodic grating RP comprises the same periodic pattern comprising one or more posts, the pattern being located at each corner of the polygon.

For example, the posts can be disposed in an arrangement of square or rectangular unit cells forming a grid. It goes without saying that other types of post dispositions can be provided, such as a hexagonal unit cell arrangement forming a "honeycomb"-type lattice.

The characteristic dimensions of the periodic grating comprise the period P of repetition of the unit cells and the dimensions of the periodic post pattern.

For example, in a case whereby the posts are cylinders, the characteristic dimensions of the periodic grating further comprise the diameter D and the height H of the cylinders. It goes without saying that the posts can take a different shape, for example a hemispherical or parallelepipedal shape.

Briefly, the selected materials and the periodic pattern of the grating RP are configured to produce, by a quantum resonance effect, constructive light interference on the side of the periodic grating RP through which incident light rays are received, and destructive light interference on the side of the periodic grating RP through which the light rays are transmitted, at the interfering wavelength in order to produce the reflection.

Figure 4:
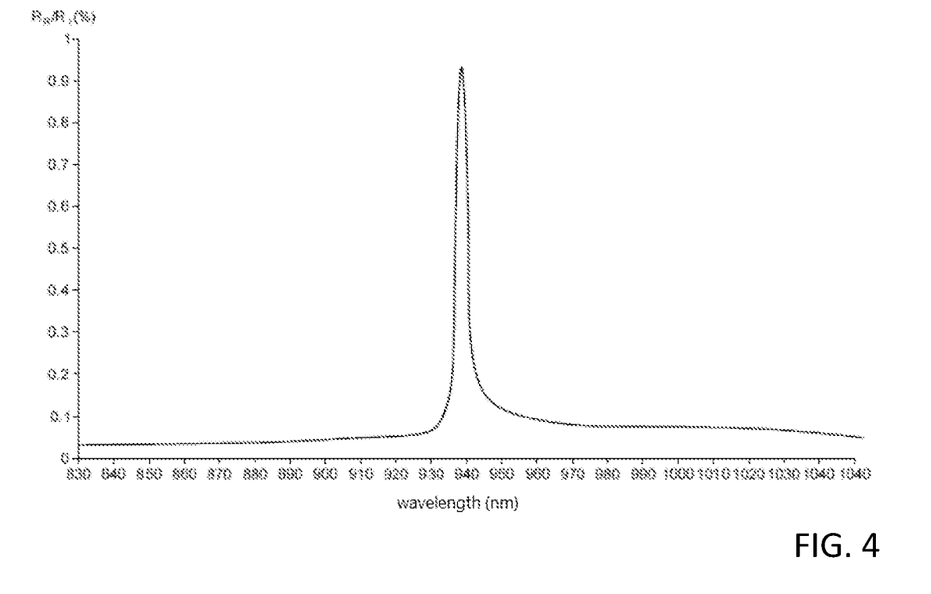
FIG. 4 shows a chart containing the results of a light reflection simulation on a first periodic grating of cylindrical posts.

FIG. 4 shows a chart containing the results of a light reflection simulation on a first periodic grating of cylindrical posts configured to specifically reflect an interfering wavelength of 940 nanometers.

In this respect, the characteristic dimensions of the posts are a height H of 20 nanometers and a diameter D of 280 nanometers. The posts are disposed on the carrier layer CS in a grid pattern with a square unit cell having a fixed periodic spacing P of 590 nm, the thickness of the carrier layer CS being 150 nanometers. The first material is silicon nitride, the second material is also silicon nitride and the third material is silicon oxide.

The chart shows a reflection percentage Rr/Ri in the form of a gain curve with a Gaussian profile.

The reflection percentage Rr/Ri is substantially less than 10% below 930 nanometers and above 960 nanometers; a clear increase in the reflection percentage Rr/Ri is observed, reaching a maximum of more than 90% at the interfering wavelength of 940 nanometers. The full width at half maximum of the gain curve is less than 10 nanometers.

The first periodic grating thus allows the wavelength of 940 nanometers to be selectively filtered from an infrared spectrum.

Figure 5:
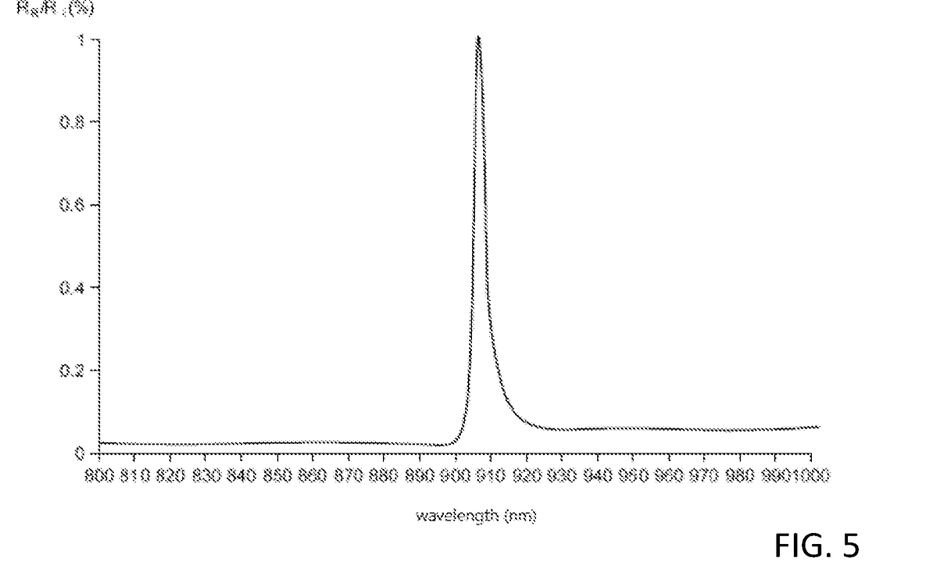
FIG. 5 shows a chart containing the results of a light reflection simulation on a second periodic grating of cylindrical posts.

FIG. 5 shows a chart containing the results of a light reflection simulation on a second periodic grating of cylindrical posts configured to specifically reflect an interfering wavelength of 905 nanometers.

In this respect, the second periodic grating differs from the first periodic grating in that the posts are disposed with a fixed periodic spacing P of 566 nm.

The chart shows a reflection percentage Rr/Ri in the form of a gain curve with a Gaussian profile.

The reflection percentage Rr/Ri is substantially less than 10% below 900 nanometers and above 920 nanometers. A clear increase in the reflection percentage Rr/Ri is observed, reaching a maximum of more than 90% at the interfering wavelength of 905 nanometers. The full width at half maximum of the gain curve is less than 10 nanometers.

The second periodic grating thus allows the wavelength of 905 nanometers to be selectively filtered from an infrared spectrum.

Figure 6:
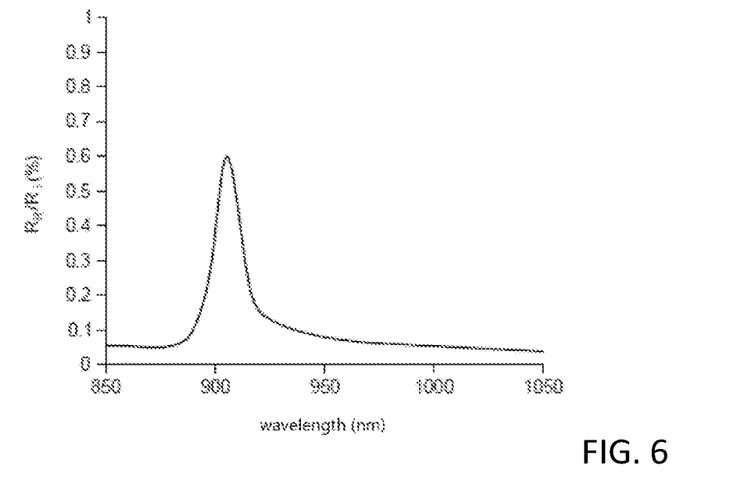
FIG. 6 shows a chart containing the results of a light reflection simulation on a third periodic grating of cylindrical posts.

FIG. 6 shows a chart containing the results of a light reflection simulation on a third periodic grating of cylindrical posts configured to specifically reflect an interfering wavelength of 905 nanometers.

The incident rays are received on the third periodic grating of posts with an angle of incidence on the third periodic grating of five degrees relative to a normal of the top surface of the carrier layer.

The characteristic dimensions of the posts are a height H of 60 nanometers and a diameter D of 280 nanometers. The posts are disposed in a grid pattern with a fixed periodic spacing P of 600 nm. The first material is silicon nitride, the second material is silicon (the cylindrical posts comprise the second material) and the third material is silicon oxide.

The chart shows a reflection percentage Rr/Ri in the form of a gain curve with a Gaussian profile according to the wavelength, and with a maximum of 60% at the interfering wavelength of 905 nanometers. The gain curve has a full width at half maximum of about 20 nanometers.

For the light rays with an angle of incidence of five degrees, the third periodic grating thus filters 60% of the interfering rays at the wavelength of 905 nanometers, and filters at least 30% of rays comprised between 895 and 915 nanometers.

Increasing the angle of incidence of the rays on the periodic grating decreases the maximum of the reflective gain curve and increases the full width at half maximum.

In this respect, a stack of anti-reflective layers can be provided, configured to correct an angle of incidence of the light rays reaching the periodic grating of posts.

The angle of incidence of the light rays on the periodic grating is rectified by the stack of anti-reflective layers.

In other words, the stack of anti-reflective layers corrects the initial angle of incidence of light rays relative to the normal of the first face of the optical filter so as to rectify the initial incident light rays so that the angle of the incident rays on the periodic grating is as close as possible to the normal.

A stack of anti-reflective layers that procures such an effect can comprise, for example, a stack of graded refractive index layers.

Thus, the stack of anti-reflective layers makes it possible to increase the maximum reflective gain and to decrease the full width at half maximum of the reflective gain for incident rays with a non-zero angle relative to the normal.

Figure 7:
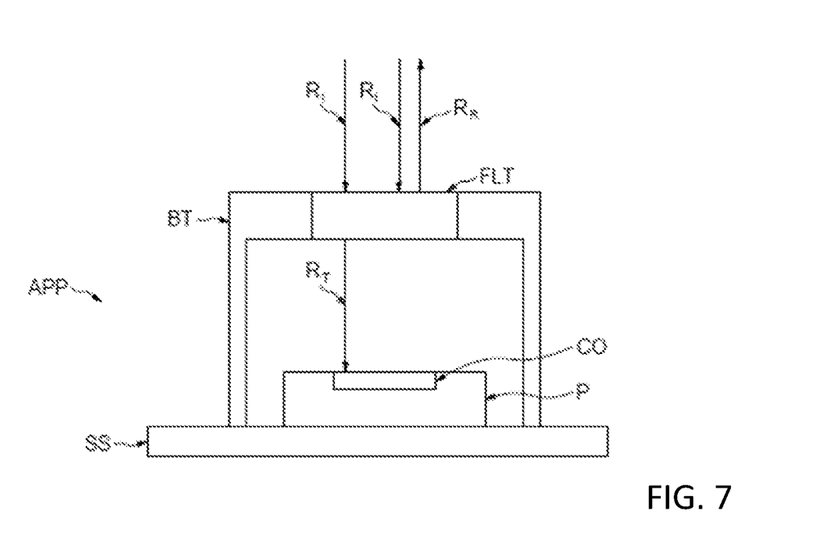
FIG. 7 shows a device configured to protect elements of an integrated optical component from one or more interfering wavelengths.

FIG. 7 shows a device APP configured to protect elements of an integrated optical component CO from one or more interfering wavelengths.

The device APP comprises an optical filter FLT, an electronic chip P including the integrated optical component CO, and a housing BT. The optical filter FLT is integrated into the housing BT and located facing the optical component CO of the electronic chip P so as to filter the light perceived by the optical component CO.

For this purpose, the optical filter FLT can comprise a stack of one or more optical filters configured to each specifically filter a different interfering wavelength.

The optical filters in the stack can be, for example, similar to the optical filters described with reference to FIGS. 1E and 2.

Alternatively, the optical filter FLT can comprise a stack in particular comprising a plurality of periodic gratings, each periodic grating comprising a respective carrier layer and posts disposed on the carrier layer, and each periodic grating being configured to reflect a different interfering wavelength such that the filter FLT selectively filters a plurality of interfering wavelengths.

The wavelengths filtered by the optical filter FLT can, for example, be wavelengths included in regulated standards for technology detecting and estimating distance using light, better known by the acronym "LIDAR" (Light Detection And Ranging) applied to motor vehicles, such as the wavelengths of 850, 905 and 1550 nanometers.

The incident light rays Ri with an interfering wavelength specifically filtered by the filter FLT are reflected Rr and thus do not reach the integrated optical component CO.

The optical filter FLT is moreover configured to transmit the incident rays Ri, except for the one or more interfering wavelengths, as transparently as possible such that, with the exception of the interfering wavelengths, a spectrum of the incident rays Ri corresponds to the spectrum of the transmitted rays Rt.

Use of the optical filter FLT thus does not disrupt the operation of the optical component CO compared to operation without the optical filter FLT.

Figure 8:
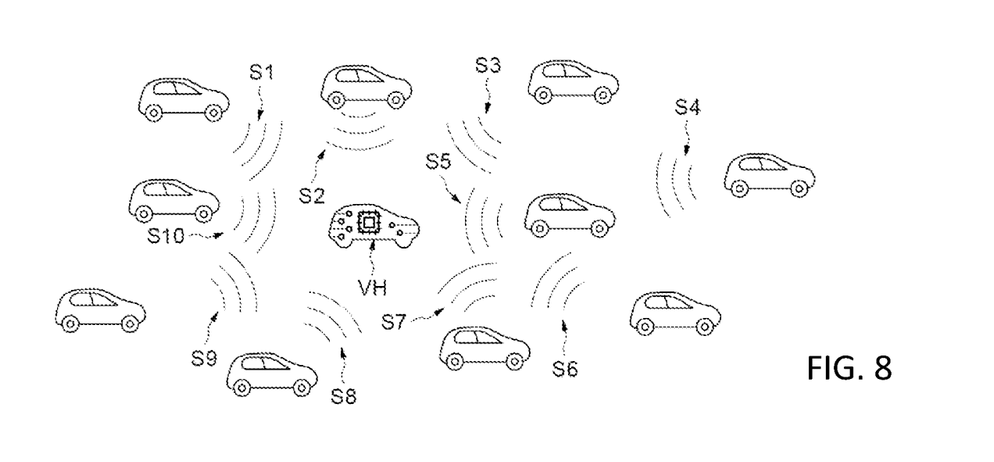
FIG. 8 shows a vehicle in which the device described with reference to FIG. 7 is installed.

FIG. 8 shows a vehicle VH in which the device described with reference to FIG. 7 is installed.

The vehicle VH is surrounded by a set of sources of interfering radiation S1 to S10, such as, for example, "LIDAR"-type emitters originating from various third-party vehicles circulating in the vicinity of the vehicle VH; this example is non-limiting and the sources can be of a different kind.

In the preceding example, the wavelengths of the interfering radiation sources S1 to S10 are typically at standard wavelengths of 850, 905 or 1,550 nanometers.

Thus, the device APP avoids overexposure of the optical component CO to the radiation from the interfering sources S1 to S10 by specifically filtering the interfering radiation.

The embodiments of the optical filters FLT1, FLT2 described hereinabove can be used to effectively filter radiation originating, for example, from "LIDAR"-type applications, which, due to the high energy level thereof, can alter or damage optical sensors that can be integrated into the device APP.

The optical filter FLT is adapted to selectively filter certain specific interference wavelengths. Thus, the optical filter FLT equipping the device APP described hereinabove filters the light intended for sensors operating in the same light spectrum as the high energy potential sources, and only removes interfering and polluting wavelengths corresponding to the high energy potential sources.

With the increasing use of the "LIDAR"-type application in the motor industry, and with the growing development of sensors, the integration of the device APP into the vehicle VH described hereinabove provides protection that can be used in particular for all types of optical sensors used in the motor industry.

The invention claimed is:

1. An optical filter, including:
   a carrier layer made of a first material;
   a periodic grating of posts disposed on the carrier layer in a periodic pattern configured by characteristic dimensions, the periodic grating of posts made of a second material having a first refractive index; and
   a layer made of a third material encompassing the periodic grating of posts and covering the carrier layer, the third material having a second refractive index that is different from the first refractive index of the second material;
   wherein characteristic dimensions of the periodic grating of posts are smaller than an interfering wavelength and configured such that the periodic grating of posts selectively reflects the light at the interfering wavelength; and
   further including a first face of said layer made of the third material covered by a stack of anti-reflective layers, wherein the stack of anti-reflective layers is configured to correct an initial angle of incidence of incident light rays on the side of the first face of the optical filter, relative to a normal of the first face of the optical filter, such that an angle of incidence of incident light rays on the periodic grating is closer to the normal than the initial angle of incidence.

2. The optical filter according to claim 1, wherein the first material, the second material, and the third material are selected such that the optical filter is transparent to light, except at the interfering wavelength, having a wavelength comprised in a wavelength range comprising the interfering wavelength.

3. The optical filter according to claim 1, wherein the periodic grating of posts is disposed on the carrier layer in a periodic arrangement comprising a unit cell of posts repeated with a fixed period, and wherein the characteristic dimensions further comprise said fixed period.

4. The optical filter according to claim 1, wherein the interfering wavelength is an infrared wavelength defined by a standard for automotive applications of detecting and estimating distance using light.

5. The optical filter according to claim 1, wherein the first material, the second material, and the third material are dielectric or semiconductor materials.

6. The optical filter according to claim 1, wherein the first material is silicon nitride, the second material is silicon nitride and the third material is silicon oxide.

7. The optical filter according to claim 1, wherein the first material is silicon nitride, the second material is silicon oxide and the third material is one of amorphous silicon or polycrystalline silicon.

8. An electronic device, comprising:
   an optical filter according to claim 1;
   a light-sensitive electronic chip; and
   a housing;
   wherein the optical filter is integrated into the housing and located facing the light-sensitive electronic chip so as to filter the light received by the light-sensitive electronic chip.

9. A vehicle, comprising: an electronic device according to claim 8.

10. A method of manufacturing an optical filter, comprising:
    forming a carrier layer made of a first material;
    forming a layer made of a second material on the carrier layer;
    etching, in the layer made of the second material, a periodic grating of posts having a periodic pattern configured by characteristic dimensions; and
    forming a layer made of a third material, on the carrier layer, encompassing the periodic grating of posts;
    wherein characteristic dimensions of the periodic grating of posts are smaller than an interfering wavelength and configured so that the periodic grating of posts selectively reflects light at the interfering wavelength; and
    forming a stack of anti-reflective layers on a first face of the layer made of the third material configured to correct an initial angle of incidence of incident light rays on the side of the first face of the optical filter, relative to a normal of the first face of the optical filter, such that an angle of incidence of incident light rays on the periodic grating is closer to the normal than the initial angle of incidence.

11. The method according to claim 10, wherein the first material, second material, and third material are selected such that the optical filter is transparent to light, except at the interfering wavelength, having a wavelength comprised in a wavelength range comprising the interfering wavelength.

12. The method according to claim 10, wherein etching comprises forming posts of the periodic grating of posts to have a cylindrical shape with a diameter and a height, and wherein the characteristic dimensions comprise the diameter and the height.

13. The method according to claim 10, wherein etching comprises forming posts of the periodic grating of posts to be disposed in a periodic arrangement comprising a unit cell of posts repeated with a fixed period, and wherein the characteristic dimensions comprise said fixed period.

14. The method according to claim 10, wherein the interfering wavelength is an infrared wavelength defined by a standard for automotive applications of detecting and estimating distance using light.

15. The method according to claim 10, wherein the first material, the second material, and the third material are dielectric or semiconductor materials.

16. The method according to claim 10, wherein the first material is silicon nitride, the second material is silicon nitride and the third material is silicon oxide.

17. The method according to claim 10, wherein the first material is silicon nitride, the second material is silicon oxide and the third material is amorphous silicon or polycrystalline silicon.

* * * * *